(12) United States Patent
Bauer et al.

(10) Patent No.: US 9,514,957 B2
(45) Date of Patent: Dec. 6, 2016

(54) INTEGRATED CIRCUIT PACKAGE

(71) Applicant: DSP Group LTD., Herzeliya (IL)

(72) Inventors: Avraham Bauer, Hod Hasharon (IL); Avraham Cohen, Kiryat Ata (IL)

(73) Assignee: DSP Group LTD., Herzeliya (IL)

( * ) Notice: Subject to any disclaimer, the term of this patent is extended or adjusted under 35 U.S.C. 154(b) by 0 days.

(21) Appl. No.: 14/616,711

(22) Filed: Feb. 8, 2015

(65) Prior Publication Data

US 2015/0235927 A1 Aug. 20, 2015

Related U.S. Application Data

(60) Provisional application No. 61/941,577, filed on Feb. 19, 2014.

(51) Int. Cl.
| | |
|---|---|
| *H01L 23/02* | (2006.01) |
| *H01L 21/3205* | (2006.01) |
| *H01L 21/48* | (2006.01) |
| *H01L 23/552* | (2006.01) |
| *H01L 23/495* | (2006.01) |
| *H01L 23/31* | (2006.01) |
| *H01L 23/00* | (2006.01) |

(52) U.S. Cl.
CPC ....... *H01L 21/3205* (2013.01); *H01L 21/4846* (2013.01); *H01L 23/49548* (2013.01); *H01L 23/49568* (2013.01); *H01L 23/552* (2013.01); *H01L 23/3121* (2013.01); *H01L 23/3135* (2013.01); *H01L 24/32* (2013.01); *H01L 24/45* (2013.01); *H01L 24/48* (2013.01); *H01L 24/73* (2013.01); *H01L 2224/32225* (2013.01); *H01L 2224/32245* (2013.01); *H01L 2224/45147* (2013.01); *H01L 2224/48091* (2013.01); *H01L 2224/48227* (2013.01); *H01L 2224/48247* (2013.01); *H01L 2224/73265* (2013.01); *H01L 2924/00014* (2013.01); *H01L 2924/14* (2013.01); *H01L 2924/15311* (2013.01); *H01L 2924/15313* (2013.01); *H01L 2924/181* (2013.01)

(58) Field of Classification Search
USPC ........ 257/678, 666, 665, 675, E23.001, 704, 257/710
See application file for complete search history.

(56) References Cited

U.S. PATENT DOCUMENTS

| 8,203,219 B2* | 6/2012 | Wyland | H01L 23/3128 257/666 |
|---|---|---|---|
| 2013/0087895 A1* | 4/2013 | Upadhyayula | H01L 23/3135 257/659 |

* cited by examiner

Primary Examiner — Timor Karimy
(74) Attorney, Agent, or Firm — Reches Patets

(57) ABSTRACT

A method that may include of at least partially surrounding with an insulating encapsulation lead frames, an integrated circuit attachment and wire bonding while preventing the insulating encapsulation from contacting at least one area of a base element; and at least partially surrounding an exterior of the insulating encapsulation with a conductive coating that contacts at least one area of the base element.

27 Claims, 7 Drawing Sheets

INTEGRATED CIRCUIT PACKAGE

RELATED APPLICATIONS

This application claims priority from U.S. provisional patent filing date Feb. 19, 2014, Ser. No. 61/941,577.

BACKGROUND OF THE INVENTION

Flat no-leads packages such as QFN (quad-flat no-leads) and DFN (dual-flat no-leads) physically and electrically connect integrated circuits to printed circuit boards (PCBs) (see: Wikipedia.org). Flat no-leads, also known as micro leadframe (MLP) and SON (small-outline no leads), is a surface-mount technology, one of several package technologies that connect ICs to the surfaces of PCBs without through-holes. Flat no-lead is a near chip scale package plastic encapsulated package made with a planar copper lead frame substrate. Perimeter lands on the package bottom provide electrical connections to the PCB. Flat no-lead packages include an exposed thermal pad to improve heat transfer out of the IC (into the PCB). Heat transfer can be further facilitated by metal vias in the thermal pad.

The QFN package includes an insulating encapsulation that limits the heat dissipation and fails to block radiated emissions from the integrated circuit enclosed in the package.

SUMMARY

According to an embodiment of the invention there may be provided a system and a method.

A method for manufacturing an integrated circuit package, the method comprises: at least partially surrounding with an insulating encapsulation a base element, an integrated circuit attachment and wire bonding while preventing the insulating encapsulation from contacting at least one area of the base element; and at least partially surrounding an exterior of the insulating encapsulation with a conductive coating that contacts the at least one area of the base element.

The device may include an integrated circuit; and an integrated circuit package; wherein the integrated circuit package comprises: a base element; an integrated circuit attachment; wire bonding; an insulating encapsulation; and a conductive coating; wherein the conductive coating contacts the base element and at least partially surrounds an exterior of the insulating encapsulation.

The base element may be a lead frame.

The conductive coating may completely surround the exterior of the insulating encapsulation.

The conductive coating may be made of a thermally conductive material.

The conductive coating may be made of an electrically conductive material.

The conductive coating may be made of a thermally and electrically conductive material.

The conductive coating contacts the base element at two or more points.

The conductive coating contacts the base element at multiple points positioned near edges of the base element.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
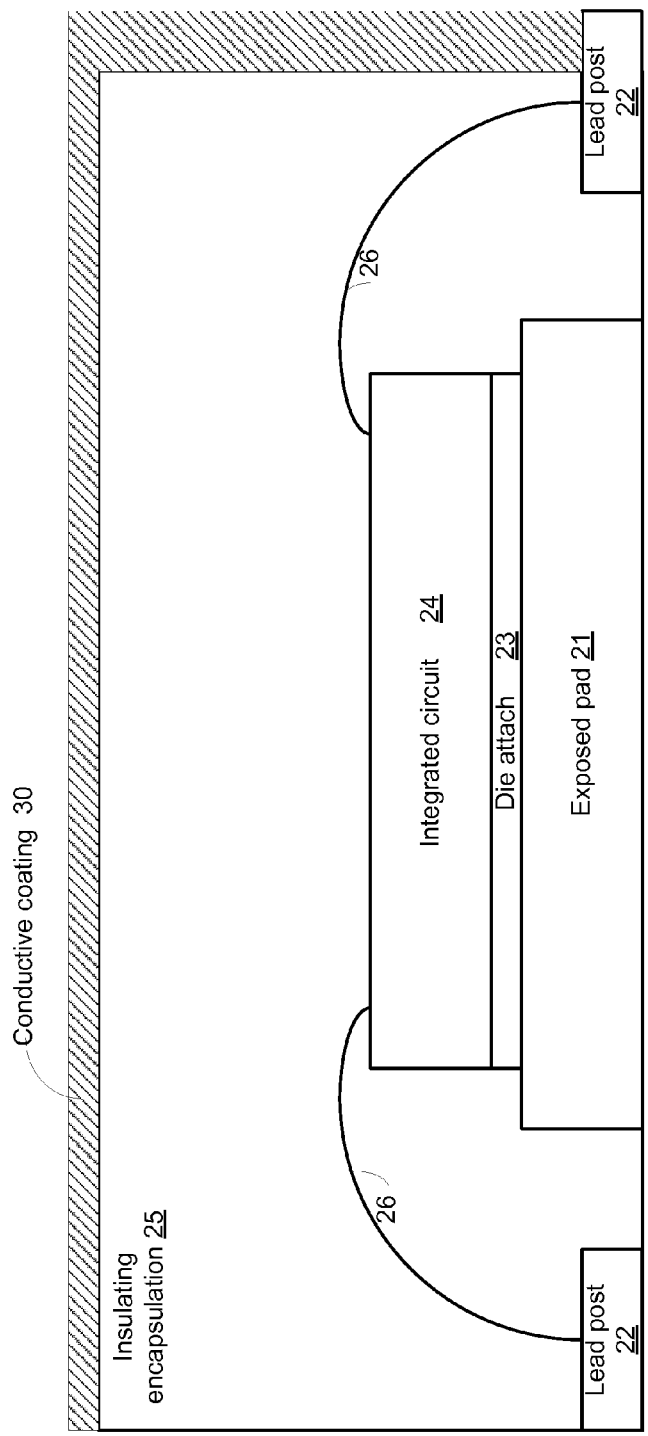
FIG. 1 is a cross sectional view of a device according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

According to an embodiment of the invention there may be provided a device that includes an integrated circuit and an integrated circuit package. The integrated circuit package may include a base element such as but not limited to a lead frame, an integrated circuit attachment, wire bonding (connects the integrated circuit with various conductors of the lead frame), an insulating encapsulation and a conductive coating. The conductive coating contacts at least one area of the lead frame and at least partially surrounds an exterior of the insulating encapsulation. A conductive coating may have a surface impedance that does not exceed $10^8$ Ohms. An insulating encapsulation has a surface impedance that may exceed $10^{11}$ Ohms.

The base element may be arranged to support the integrated circuit or otherwise positioned (in at least one orientation of the device) below the integrated circuit. It may include one or more conductive elements. In a QFN package the base element is also known as a lead frame.

While the following examples refer to QFN packaged the system and method are not limited to QFN packages or the manufacturing of QFN packages and can be applied on other substrate or non-substrate type package such as LGA or BGA.

FIG. 1 is a cross sectional view of a device 10 according to an embodiment of the invention.

Device 10 includes integrated circuit 24 and an integrated circuit package. The integrated circuit package may include a lead frame (denoted 29 in FIGS. 5 and 6), an integrated circuit attachment ("die attach" 23), wire bonding 26 (connects the integrated circuit 24 with various conductors such as lead post 22 of the lead frame), an insulating encapsulation 25 and a conductive coating 30. In FIG. 1 the conductive coating 30 partially surrounds the insulating encapsulation 25. FIG. 1 also shows exposed pad 21 that is a part of the lead frame. The conductive coating 30 contacts a part of a right lead post 22 and does not contact a left lead post 22.

The integrated circuit attachment can be made of Silicon, Gallium arsenide or any other material. The integrated circuit can be bonded to it—although non-bonding solutions can also be provided and may include TSV (through silicon via), flip chip and the like. The wire bonding can be a copper pillar flipchip or another arrangement.

Figure 2:
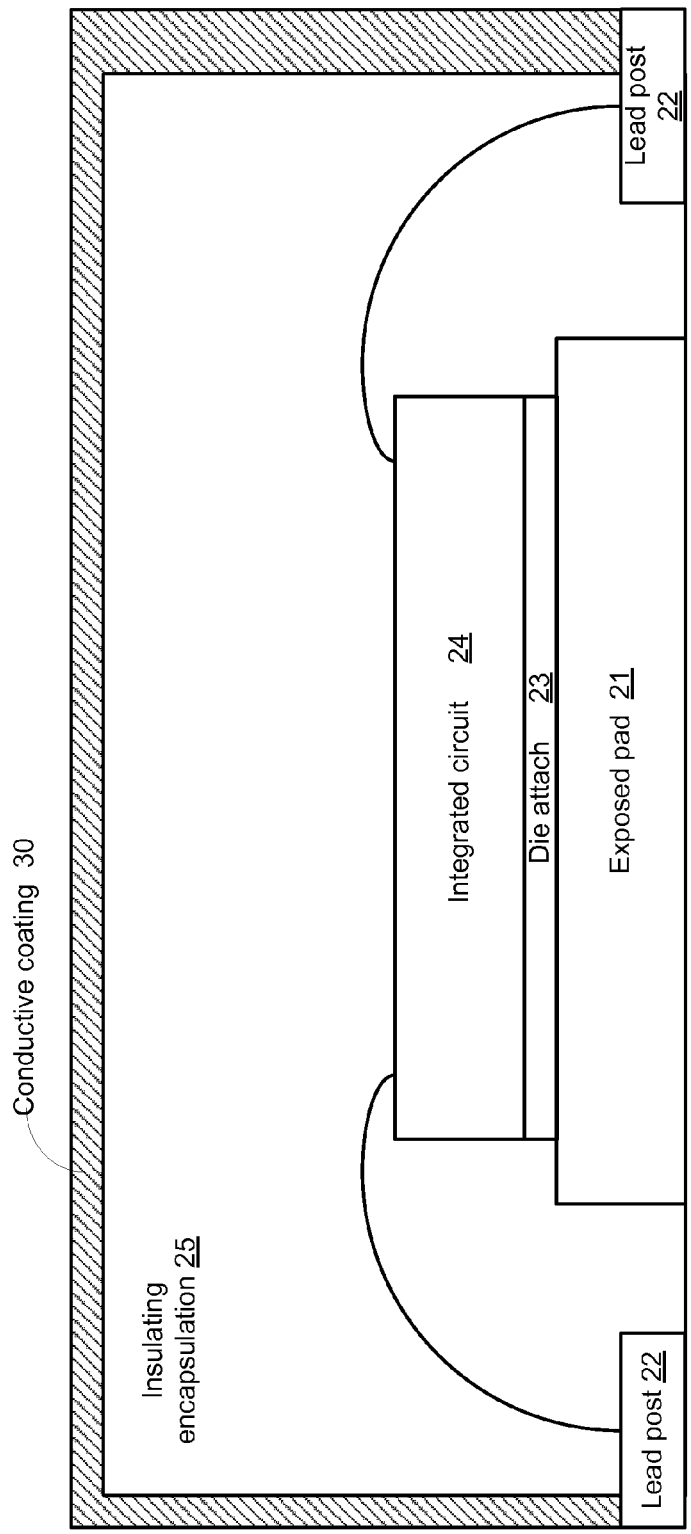
FIG. 2 is a cross sectional view of a device according to an embodiment of the invention.

FIG. 2 is a cross sectional view of a device 11 according to an embodiment of the invention.

In FIG. 2 the conductive coating 30 completely surrounds the insulating encapsulation 25. The conductive coating 30 contacts a part of a right lead post 22 and a part of a left lead post 22.

Figure 3:
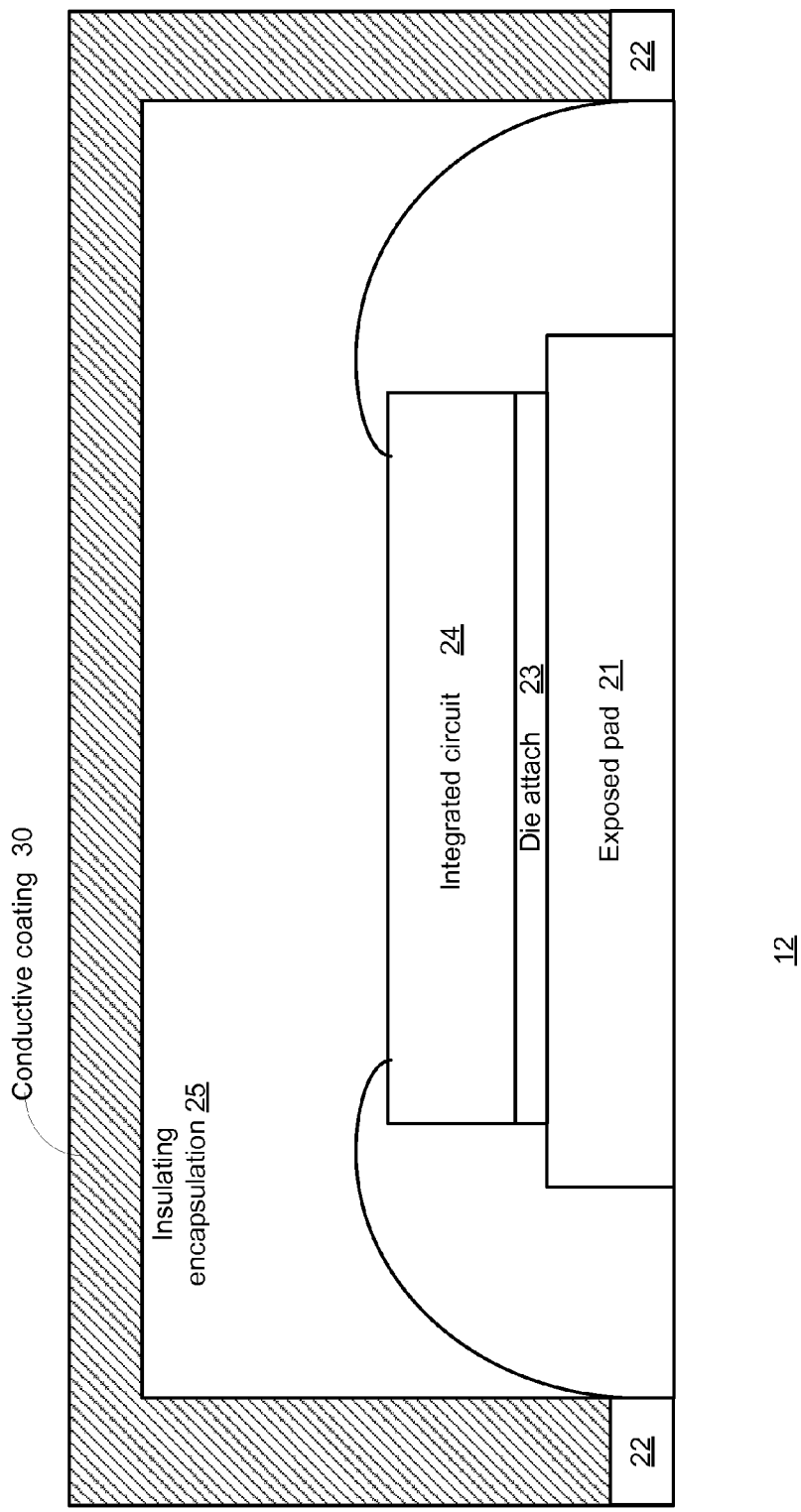
FIG. 3 is a cross sectional view of a device according to an embodiment of the invention.

FIG. 3 is a cross sectional view of a device 12 according to an embodiment of the invention.

In FIG. 3 the conductive coating 30 completely surrounds the insulating encapsulation 25. The conductive coating 30 contacts the entire right lead post 22 and the entire left lead post 22.

Figure 4:
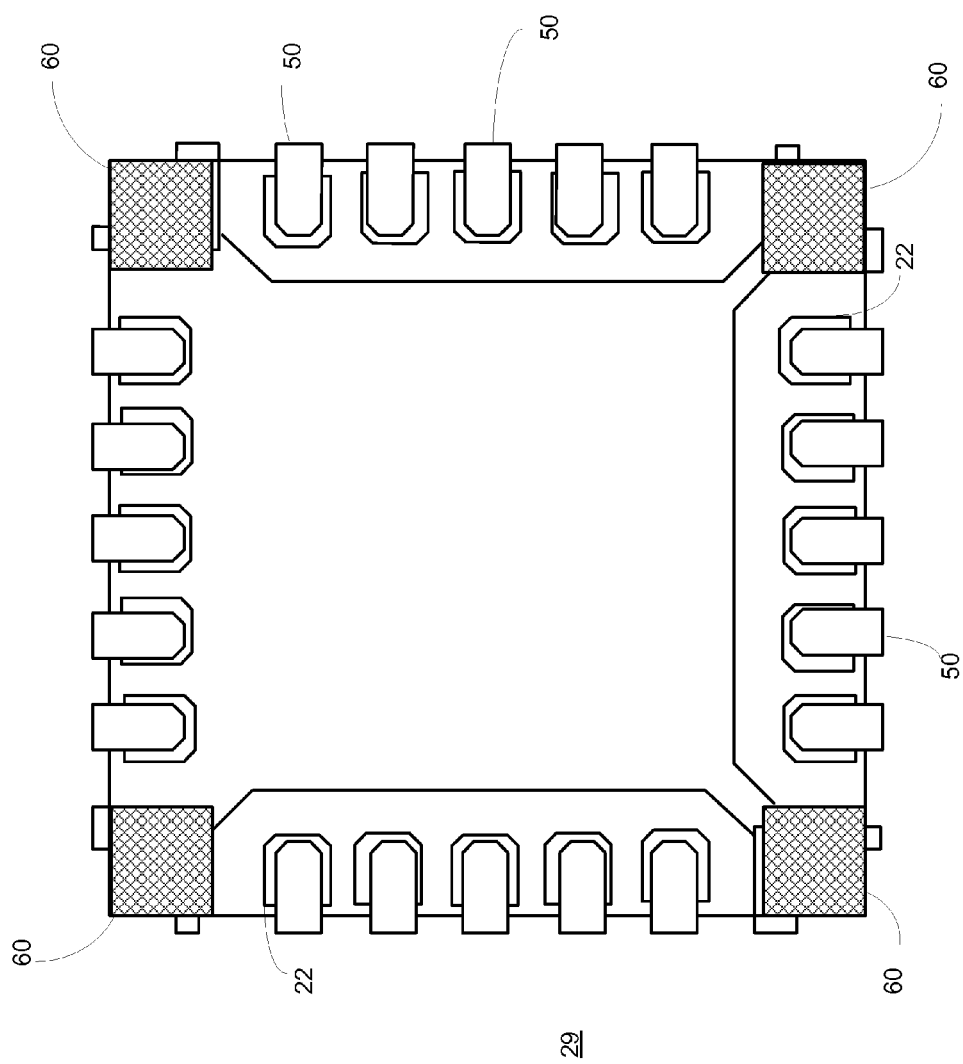
FIG. 4 is a top view of a lead frame according to an embodiment of the invention.

FIG. 4 is a top view of a lead frame 29 according to an embodiment of the invention. FIG. 4 illustrates that some four rectangular areas 60 located at the corners of the lead frame are not contacted by the insulating enclosure 25—and should be contacted by the coating material 30 while others areas of the lead frame 29 can be located below the insulating encapsulation 25.

Figure 5:
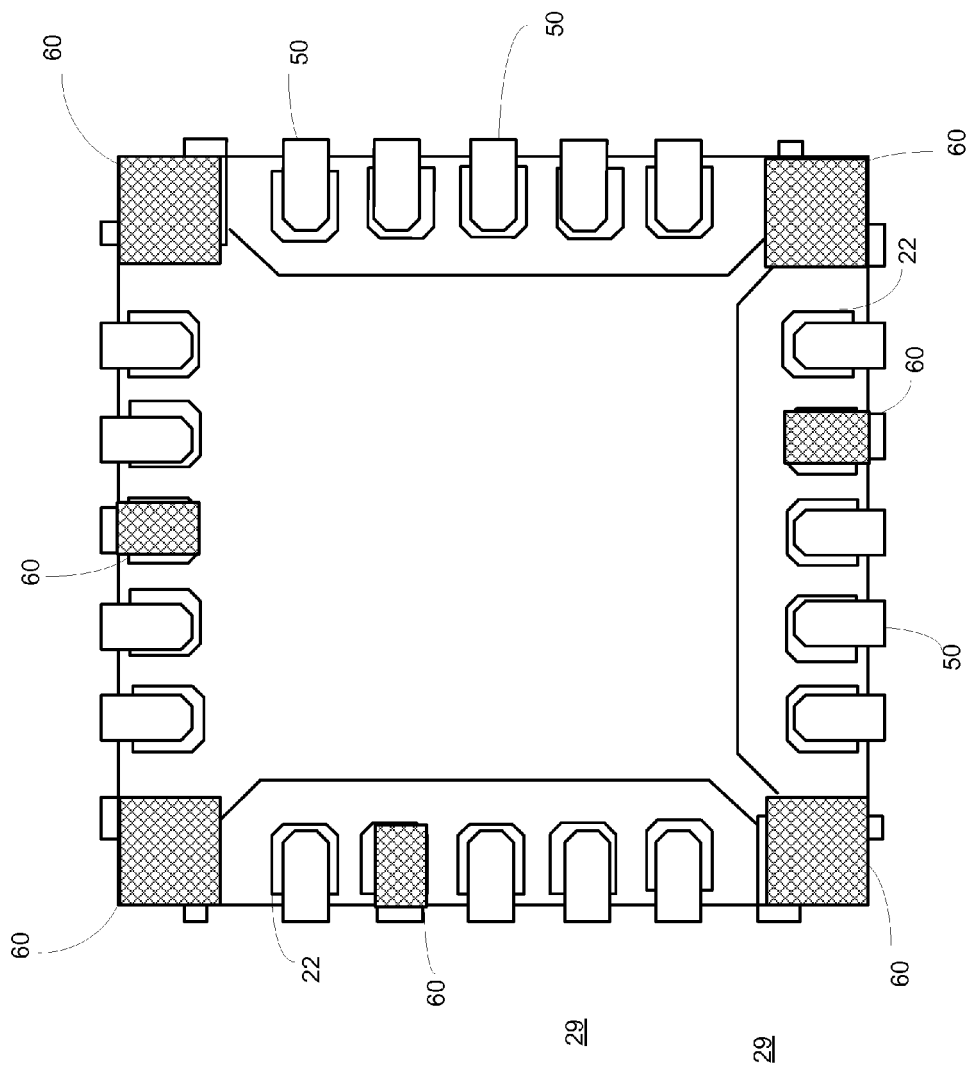
FIG. 5 is a top view of a lead frame according to an embodiment of the invention.

FIG. 5 is a top view of a lead frame 29 according to an embodiment of the invention. FIG. 5 illustrates that some four rectangular areas 60 located at the corners of the lead frame as well as three lead posts are not contacted by the insulating enclosure 25—and should be contacted by the coating material 30 while others areas of the lead frame 29 can be located below the insulating encapsulation 25.

Figure 6:
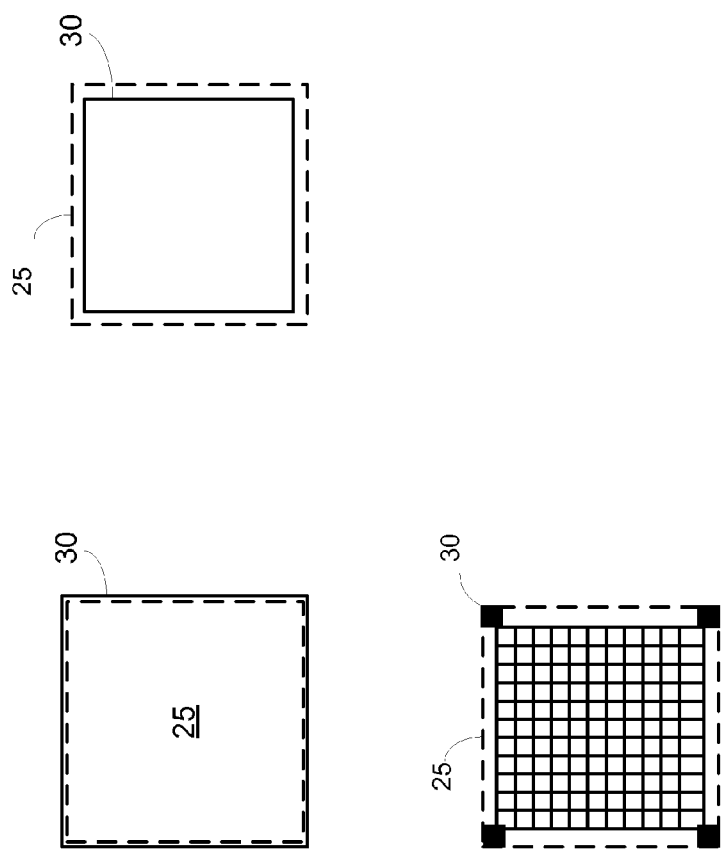
FIG. 6 illustrates insulating encapsulations and conductive coatings according to various embodiments of the invention.

FIG. 6 illustrates various embodiments of the insulating encapsulation 25 and the conductive coating 30 according to various embodiments of the invention.

The conductive coating 30 can be deposited such as to completely cover areas of the exterior of the insulating encapsulation 25, can be deposited such as to partially cover such areas. It may, for example be deposited to provide a mesh. It can cover almost all of the insulating encapsulation 25 or the entire insulating encapsulation 25.

The conductive coating may be made of a thermally conductive material, of an electrically conductive material or of a material that is both electrically and thermally conductive.

A non-limiting example of conductive coating materials are illustrated in U.S. Pat. No. 4,035,265 of Saunders that discloses electrically conductive paint compositions employing graphite and colloidal carbon. The graphite is subjected to wet grinding so as to reduce the graphite to thin platelets. The colloidal carbon employed consists of particles having a size from 20 to 50 milli-microns. The final composition (including the article it is applied to) is used as a heat source when electrical current is passed through the coating.

Yet another non-limiting examples of the conductive coating materials include nickel or nickel alloy that can be sprayed and/or silver epoxy adhesive (such as the 8331 silver conductive epoxy adhesive of MgChemicals Burlington, Canada).

The conductive coating may be deposited by spraying, brushing or any other process. The conductive coating may be deposited when not being in a solid form—it may be liquid, a paste, a powder and the like.

The deposition of the conductive coating may not require connecting the coating to the insulating enclosure by mechanical elements such as bolts. Thus simplifying the coating process in relation to the mechanical attachment of a solid plate.

The conductive coating may contact the lead frame at one, two, three, four or more locations. These locations may include conductors of the lead frame but this is not necessarily so.

When the conductive coating is used to reduce an emission of electromagnetic radiation from the device it may completely surround the entire insulating enclosure, or otherwise be formed to shield the electromagnetic radiation. It may form an electromagnetic cage.

When the conductive coating is used to increase the heat dissipation of the device it may completely or partially surround the insulating enclosure.

The insulating enclosure can be made of a polymer.

Figure 7:
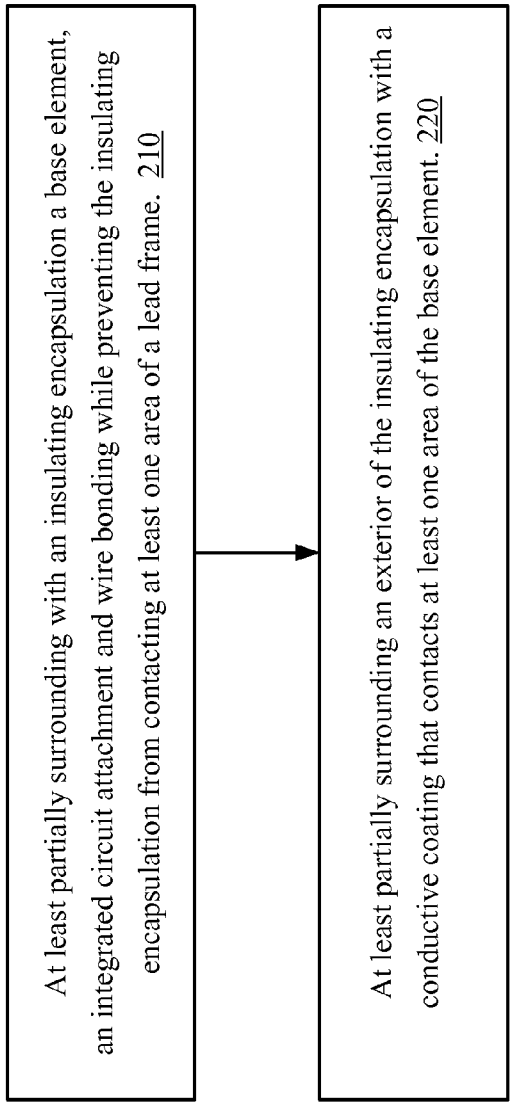
FIG. 7 illustrates a method according to an embodiment of the invention.

FIG. 7 illustrates method 200 according to an embodiment of the invention.

Method 200 is for manufacturing an integrated circuit package.

Method 200 may start by stage 210 of at least partially surrounding with an insulating encapsulation lead frames, an integrated circuit attachment and wire bonding while preventing the insulating encapsulation from contacting at least one area of a base element such as a lead frame.

Stage 210 may be followed by stage 220 of at least partially surrounding an exterior of the insulating encapsulation with a conductive coating that contacts at least one area of the base element. The contact can be made to a conductive element (such as lead post) of the base element.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device, comprising:
   an integrated circuit; and
   an integrated circuit package;
   wherein the integrated circuit package comprises:
      a base element;
      an integrated circuit attachment that contacts a bottom of the integrated circuit;
      wire bonding;
      an insulating encapsulation that surrounds the integrated circuit; and
      a conductive coating;
   wherein the conductive coating contacts only a group of spaced apart areas of the base element and at least partially surrounds an exterior of the insulating encapsulation.

2. The device according to claim 1 wherein the base element is a lead frame.

3. The device according to claim 1 wherein the conductive coating completely surrounds the exterior of the insulating encapsulation.

4. The device according to claim 1 wherein the conductive coating is made of a thermally conductive material.

5. The device according to claim 1 wherein the conductive coating is made of an electrically conductive material.

6. The device according to claim 1 wherein the conductive coating is made of a thermally and electrically conductive material.

7. The device according to claim 1 wherein the conductive coating contacts the base element at two or more points.

8. The device according to claim 1 wherein the group of spaced apart areas consists of areas that are located at edges of the base element.

9. The device according to claim 1 wherein the integrated circuit package is a flat non-leads package.

10. The device according to claim 1 wherein the integrated circuit package is a Quad-flat no-leads package.

11. The device according to claim 1 wherein the group of spaced apart areas consists of four areas that are located at edges of the base element.

12. The device according to claim 1 wherein the group of spaced apart areas consists of four areas that are located at edges of the base element and multiple areas of the base element that are spaced apart from each one of the four areas that are located at the edges of the base element.

13. The device according to claim 1 wherein the conductive coating is a mesh.

14. The device according to claim 1 wherein the conductive coating forms an electromagnetic cage.

15. A device, comprising:
    an integrated circuit; and
    an integrated circuit package;
    wherein the integrated circuit package comprises:
       a base element;
       an integrated circuit attachment that contacts a bottom of the integrated circuit;
       wire bonding;
       an insulating encapsulation that surrounds the integrated circuit; and
       a conductive coating; and
    wherein the conductive coating is a mesh and contacts the base element and at least partially surrounds an exterior of the insulating encapsulation.

16. The device according to claim 15 wherein the integrated circuit package is a flat non-leads package.

17. The device according to claim 15 wherein the integrated circuit package is a Quad-flat no-leads package.

18. The device according to claim 15 wherein the conductive coating contacts the base element at four or more points.

19. The device according to claim 15 wherein the conductive coating contacts the base element at areas that are located at corners of the base element and at areas that are located outside the corners of the base element.

20. The device according to claim 15 wherein the conductive coating forms an electromagnetic cage.

21. The device according to claim 15 wherein the base element is a lead frame.

22. The device according to claim 15 wherein the conductive coating completely surrounds the exterior of the insulating encapsulation.

23. The device according to claim 15 wherein the conductive coating is made of a thermally conductive material.

24. The device according to claim 15 wherein the conductive coating is made of an electrically conductive material.

25. The device according to claim 15 wherein the conductive coating is made of a thermally and electrically conductive material.

26. The device according to claim 15 wherein the conductive coating contacts the base element at two or more points.

27. The device according to claim 15 wherein the conductive coating contacts the base element at multiple points positioned near edges of the base element.

* * * * *